United States Patent

Hong

[11] Patent Number: 6,025,229
[45] Date of Patent: Feb. 15, 2000

[54] METHOD OF FABRICATING SPLIT-GATE SOURCE SIDE INJECTION FLASH MEMORY ARRAY

[75] Inventor: Gary Hong, Hsin-Chu, Taiwan

[73] Assignee: United Semiconductor Corp., Hsinchu, Taiwan

[21] Appl. No.: 09/076,672

[22] Filed: May 12, 1998

[30] Foreign Application Priority Data

Dec. 24, 1997 [TW] Taiwan .................................. 86119668

[51] Int. Cl.[7] .............................................. H01L 21/8247
[52] U.S. Cl. ......................... 438/264; 438/286; 438/304
[58] Field of Search .................................. 438/257–267, 438/286, 304

[56] References Cited

U.S. PATENT DOCUMENTS

| | | |
|---|---|---|
| 5,498,555 | 3/1996 | Lin . |
| 5,618,742 | 4/1997 | Shone et al. .............................. 438/263 |
| 5,631,482 | 5/1997 | Hong ........................................ 257/326 |
| 5,677,215 | 10/1997 | Goo .......................................... 438/257 |
| 5,705,416 | 1/1998 | Kim et al. ................................. 438/257 |
| 5,854,108 | 12/1998 | Hsu et al. ................................. 438/257 |
| 5,882,970 | 3/1999 | Lin et al. .................................. 438/264 |
| 5,899,718 | 5/1999 | Chen et al. ............................... 438/264 |
| 5,915,176 | 6/1999 | Lim .......................................... 438/257 |

*Primary Examiner*—Richard Booth
*Attorney, Agent, or Firm*—Thomas, Kayden, Horstemeyer & Risley

[57] ABSTRACT

A split-gate source side injection flash memory structure that utilizes the polysilicon spacers formed on the sidewalls of the control gate and the floating gate, and the difference in concentration and depth between the source region and the drain region. By applying suitable operating voltage to the polysilicon spacers above the respective source region and drain region, operation of the flash memory can be properly controlled. Because a source-side injection is obtained in this invention, hence a higher programming efficiency is achieved.

26 Claims, 4 Drawing Sheets

METHOD OF FABRICATING SPLIT-GATE SOURCE SIDE INJECTION FLASH MEMORY ARRAY

CROSS-REFERENCE TO RELATED APPLICATION

This application claims the priority benefit of Taiwan application serial no. 86119668, filed Dec. 24, 1997, the full disclosure of which is incorporated herein by reference.

BACKGROUND OF THE INVENTION

1. Field of Invention

The present invention relates to a flash memory structure and its method of manufacture. More particularly, the present invention relates to a flash memory having a split-gate source side injection structure and its method of manufacture.

2. Description of Related Art

Nonvolatile memories are now extensively used in many electronic devices. For example, devices for storing structural data, devices for storing programming data or other intermediate data that needs to be retrieved and stored repetitively all use some form of nonvolatile memory. The most widely used type of programmable nonvolatile memory in personal computers and electronic equipment include the erasable electrical programmable read-only-memories (EEPROMs). A conventional EEPROM is a structure having a floating gate transistor. EEPROM has many advantages, including the capability of writing data into, erase data from or storing data permanently. However, the storage and retrieval rate of a conventional EEPROM is rather slow. Hence, an EEPROM having a faster storage/retrieval rate known as flash memory is developed.

FIG. 1 is a cross-sectional view showing the structure of a conventional flash memory unit. As shown in FIG. 1, the basic component of a conventional flash memory is a floating gate transistor. The floating gate transistor is constructed by forming a tunneling oxide layer 110 over a P-type substrate 100, and then forming a floating gate layer 120 over the tunneling oxide layer 110. A dielectric layer 130 is then formed over the floating gate layer 120. After that, a control gate layer 140 is formed over the dielectric layer 130. Subsequently, N-type drain region 150 and source region 160 are formed in the semiconductor substrate 100 on each side of the floating gate 120. This is followed by forming oxide spacers 170 on the sidewalls of the floating gate 120 and the control gate 140 in order to protect the floating gate transistor. The Fowler-Nordheim tunneling effect is utilized in the operation of a flash memory. When data need to be stored in the flash memory, a high voltage of around 12V is applied between the drain terminal region 150 and the source terminal 160. Similarly, a high voltage is also applied to the control gate 140. Hot electrons flowing out from the source region 160 will tunnel through the tunneling oxide layer 110 near the drain region 150. The injected hot carriers will then be trapped inside the floating gate 120, thereby increasing the threshold voltage of the floating gate transistor and achieving the data storage function. On the other hand, when data need to be erased from the flash memory, a negative voltage of suitable magnitude is applied to the control gate 140. Electrons trapped inside the floating gate 120 will be able to tunnel in a reverse direction through the tunneling oxide layer 110 away from the floating gate 120. Hence, the stored data in the flash memory is erased, and the floating gate transistor returns to its previous state.

The source region and the drain region of the flash memory are located symmetrically on each side of the floating gate with each having an identical diffusion profile of impurities. Therefore, a sufficiently high electric field must be generated in the channel before hot carriers can be injected through the tunneling oxide layer near the drain region and landed inside the floating gate. In other words, a high voltage must be supplied between the drain and source terminal.

In light of the foregoing, there is a need to improve the flash memory structure for increasing programming efficiency.

SUMMARY OF THE INVENTION

Accordingly, the present invention is to provide a flash memory structure that has source/drain regions of different depth. Through applying different operating voltages to the polysilicon spacers on each side of the control gate, a source-side injection device capable of increasing programming efficiency is created.

To achieve these and other advantages and in accordance with the purpose of the invention, as embodied and broadly described herein, the invention provides a method for manufacturing a flash memory. The method comprises the steps of first providing a substrate, and then forming sequentially a tunneling oxide layer and a first polysilicon layer over the substrate. Thereafter, the first polysilicon layer is patterned to form a plurality of separate parallel first polysilicon lines. Next, an inner dielectric layer and a second polysilicon layer are sequentially formed over the first polysilicon lines and the substrate. Then, the second polysilicon layer, the inner dielectric layer and the first polysilicon lines are patterned forming a plurality of separate parallel second polysilicon lines that run perpendicular to the first polysilicon lines. The second polysilicon line acts as a floating gate for a flash memory, while the patterned first polysilicon line acts as a control gate. Thereafter, a photoresist layer is coated over the substrate. Using the photoresist layer as a mask, a first ion implantation operation and then a thermal operation are performed to form a drain region in a portion of the substrate. During the thermal processing operation, a layer of oxide is also produced over the substrate. Subsequently, polysilicon spacers are formed on the sidewalls of the control gate, the inner dielectric layer and the floating gate. Finally, a second ion implantation operation is carried out to form a source region in another portion of the substrate.

In another aspect, the invention provides a split-gate source side injection flash memory structure that comprises a flash memory gate structure having a semiconductor substrate, a tunneling oxide layer formed above the semiconductor substrate, a floating gate formed above the tunneling oxide layer, an inner dielectric layer formed above the floating gate layer, and a control gate formed above the dielectric layer. The split-gate source side injection flash memory structure further includes polysilicon spacers formed on the sidewalls of the floating gate and the control gate, a source region formed in a portion of the semiconductor substrate, and a drain region formed in another portion of the semiconductor substrate with part of it lying underneath the floating gate. Furthermore, there is an oxide layer between the flash memory structure and the polysilicon spacer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
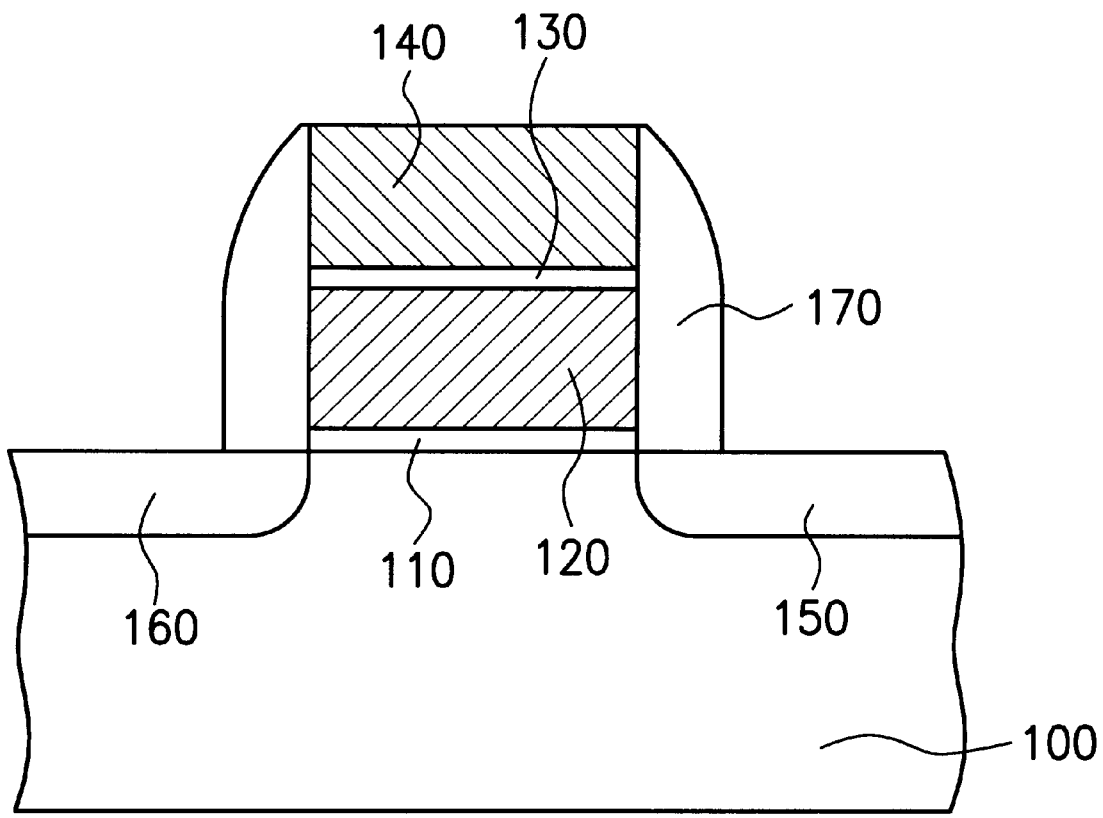
FIG. 1 is a cross-sectional view showing the structure of a conventional flash memory unit.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in producing a flash memory structure according to one preferred embodiment of this invention.

Figure 2A:
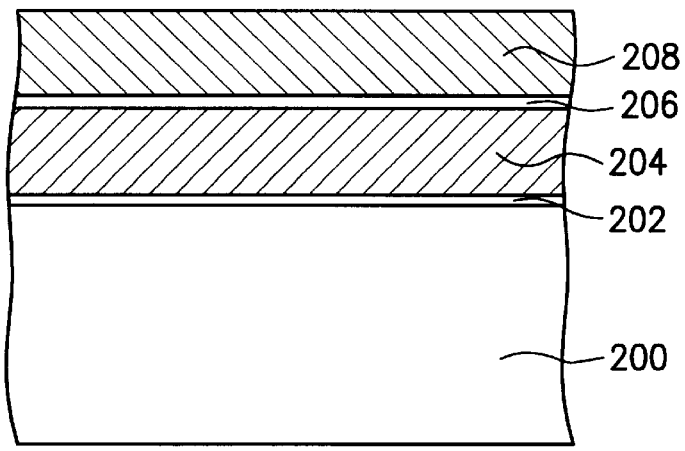
FIGS. 2A through 2E are cross-sectional views showing the progression of manufacturing steps in producing a flash memory structure according to one preferred embodiment of this invention.

First, as shown in FIG. 2A, a silicon substrate 200 having lightly doped P-type ions, for example, boron ions, is provided. Then, a local oxidation of silicon (LOCOS) technique is used to form a field oxide, or a shallow trench isolation method is used to form a device isolation structure (not shown) for defining the device region. Thereafter, a thin gate oxide layer 202 is grown over the substrate 200 acting as a tunneling oxide layer. The gate oxide layer 202 need to be thin, preferably having a thickness of between 50 Å to 200 Å, since hot carriers must be able to tunnel through the tunneling oxide layer during data write or erase operation. Next, a first polysilicon layer preferably having a thickness of about 800 Å to 2000 Å is formed over the gate oxide layer 202. The first polysilicon layer can be impurities-doped to increase its electrical conductivity. In general, an ion implantation method is used to dope the impurities into the first polysilicon layer. The impurity can be, for example, phosphorus ions, implanted with an energy level of about 20 to 50 KeV and a dosage concentration of about $10^{14}$ to $10^{15}$ atoms/cm$^2$. Thereafter, using a photolithographic processing operation, the first polysilicon layer is defined and then a portion of the first polysilicon layer is removed to form a plurality of separate parallel first polysilicon lines 204. Next, using a thermal oxidation method, an inner dielectric layer 206 is formed over the first polysilicon lines 204 and the substrate 200. The inner dielectric layer can be, for example, an oxide layer or an oxide/nitride/oxide (ONO) composite layer, preferably having a thickness of about 50 Å to 400 Å. In a subsequent step, a second polysilicon layer 208 preferably having a thickness of about 1000 Å to 2000 Å is deposited over the inner dielectric layer and the substrate 200. Moreover, an ion implantation treatment can be performed to increase the electrical conductivity of the second polysilicon layer 208. In general, the ion implantation treatment is carried out using phosphorus ions having an implanting energy level of about 20 to 50 KeV and a dosage concentration of about $10^{15}$ to $10^{16}$ atoms/cm$^2$.

Figure 2B:
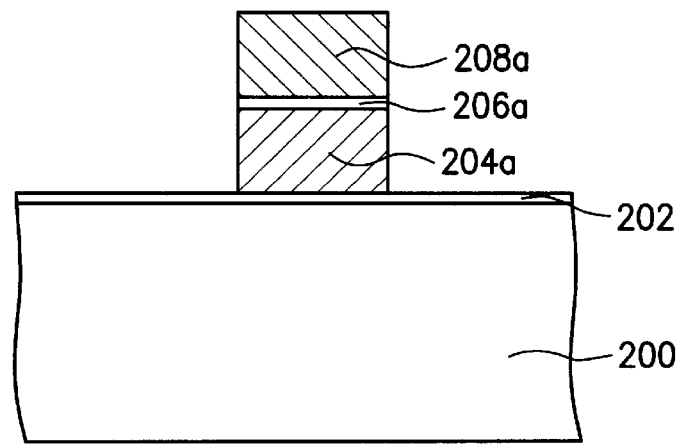

Thereafter, as shown in FIG. 2B, the second polysilicon layer 208, the inner dielectric layer 206 and the first polysilicon lines 204 are patterned to form a plurality of separate parallel second polysilicon lines 208a that are perpendicular to the first polysilicon lines 204. The second polysilicon line 208a, the inner dielectric layer 206a and the first polysilicon line 204a together constitute a stacked-gate structure, wherein the second polysilicon line 208a acts as a floating gate and the patterned first polysilicon line 204a acts as a control gate for the flash memory structure.

Figure 2C:
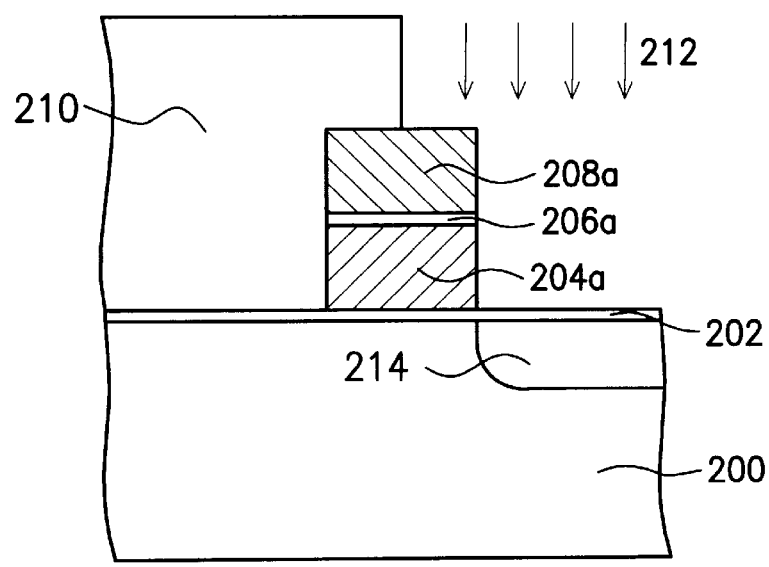

Next, as shown in FIG. 2C, a photoresist layer 210 is coated over the substrate 200 covering a portion of the substrate and a portion of the control gate 208a. Then, using the photoresist layer 210 as a mask, a first ion implantation is carried out implanting ions 212, for example, arsenic ions or phosphorus ions, into the substrate 200 using a concentration level of about $1*10^{15}$ to $8*10^{15}$ /cm$^2$ and energy level of about 50 KeV. Consequently, the N-type drain region 214a of a flash memory structure is formed.

Figure 2D:
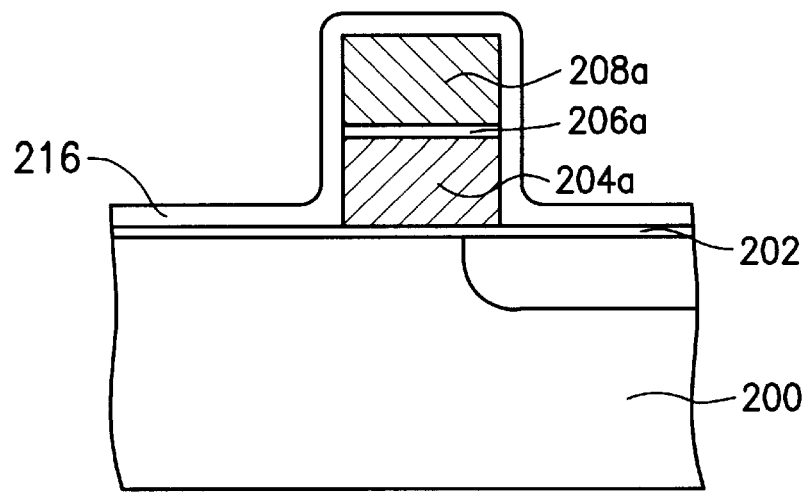

Next, as shown in FIG. 2D, a thermal processing operation is performed to drive in the implanted ions into the substrate 200 resulting in an enhanced depth and area of coverage in the drain region. As shown in FIG. 2D, portions of the ion-doped drain region 21 a now expand into an area underneath the floating gate 204a. Furthermore, an oxide layer 216 is formed over the control gate 208a, the floating gate 204a and the substrate 200 due to the thermal processing operation above. The thermal processing operation is carried out for about 10 to 30 minutes at a temperature of about 900° C. to 1000° C.

Figure 2E:
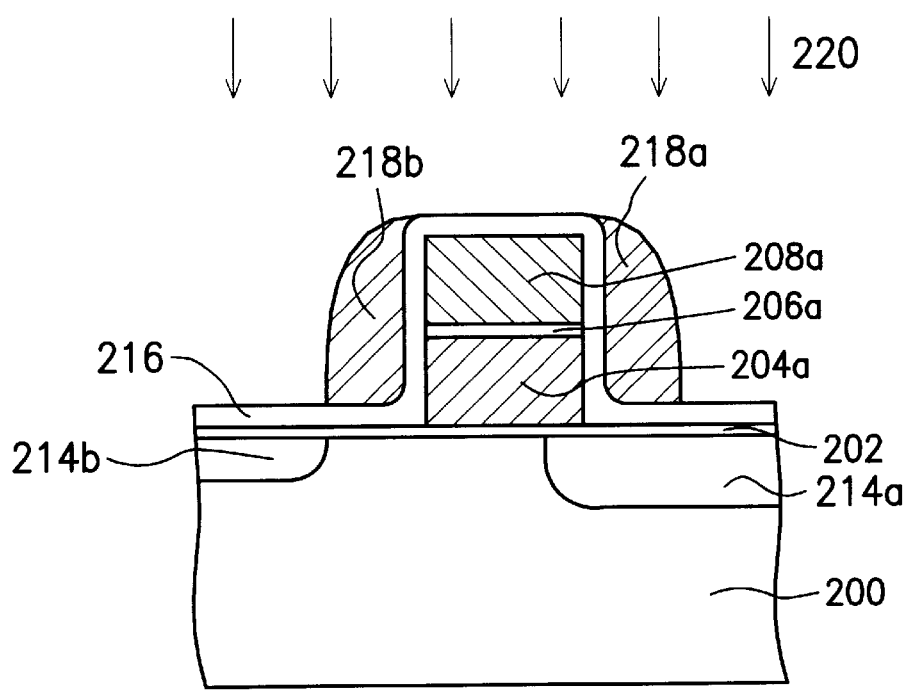

Next, as shown in FIG. 2E, a third polysilicon layer is forming above the oxide layer 216 using, for example, a chemical vapor deposition method. Then, the third polysilicon layer is etched back to form polysilicon spacers 218a and 218b on the sidewalls of the control gate 208a and the floating gate 204a. Thickness of deposition for the third polysilicon layer depends on the thickness requirement for the polysilicon spacer, and is preferably between about 1000 Å to 5000 Å. Thereafter, a second ion implantation is carried out implanting ions 220, for example, arsenic or phosphorus ions, into the substrate 200 using a dose level of about $1*10^{15}$ and energy level of about 50 KeV. Consequently, the N-type source region 214b, which has a smaller implantation depth than the aforementioned N-type drain region 214a of a flash memory structure, is formed.

In the subsequent step, conventional manufacturing processes are performed. For example, a passivation layer is formed over the substrate. Then, the passivation layer is patterned and then etched to form a contact window. Thereafter, a metallic layer is sputtered into the contact window and surrounding area. Next, the metallic layer is again patterned and etched to form metallic interconnects.

Figure 3:
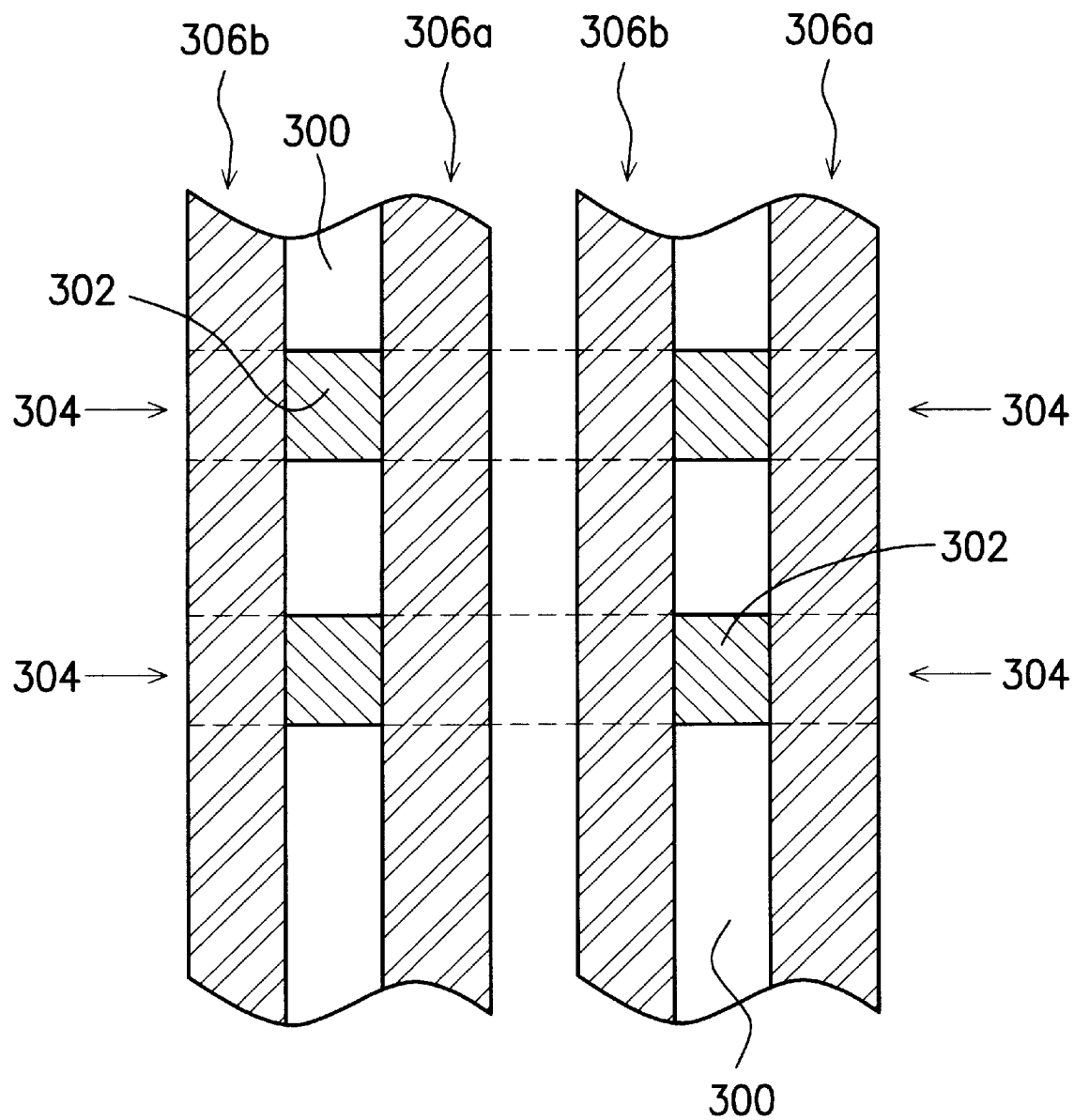
FIG. 3 is a top view showing the general layout of a flash memory array fabricated according to one preferred embodiment of this invention.

FIG. 3 is a top view showing the general layout of a flash memory array fabricated according to one preferred embodiment of this invention. As shown in FIG. 3, the layout includes device isolation structures 300 for separating memory cells, floating gates 302, control gates 304 and polysilicon spacers 306a that lie above the drain region and polysilicon spacers 306b that lie above the source region.

According to the split-gate source side injection flash memory of this invention, the voltage setup for read, program and erase actions are listed in Table 1 below.

TABLE 1

|  | Drain Terminal | Source Terminal | Control Gate | Polysilicon Spacer (Source Terminal) | Polysilicon Spacer (Drain Terminal) |
|---|---|---|---|---|---|
| Program | 3–5 V | 0 V | 3–5 V | 5–15 V | 0.5–2 V |
| Erase | 0 V | 0 V | 10–20 V | 0 V | 0 V |
| Read | 1 V | 0 V | 3–5 V | 0 V | 3–5 V |

When the memory cell undergoes a memory program operation, the source terminal is grounded while the drain terminal is connected to a voltage source of about 5V. Through this applied potential, the floating gate above the channel region of the substrate is coupled. Furthermore, according to the structure fabricated according to the preferred embodiment of this invention, a high voltage can be applied to the polysilicon spacer 306a above the drain region. That is, a high voltage of about 5 to 15V is applied to the polysilicon spacer (Source terminal) as shown in Table 1 so that the high voltage is coupled to the floating gate 302. Consequently, an even higher voltage is obtained in the channel region. A relatively lower voltage of about 0.5 to 2V is applied to the polysilicon spacer 306b, that is, the polysilicon spacer (Drain terminal) as shown in Table 1, thereby forming a weak conduction region in the neighborhood of the source region. Under the influence of the applied potentials, hot carriers will tend to inject from the source terminal to the floating gate 302, hence the name "source-side injection". Consequently, programming efficiency can be increased while programming current can be lowered.

When the memory cell undergoes a data erase operation, both the source and the drain terminals are grounded. Only a high voltage of about 5V to 15V is applied to the control gate 304. The applied potential is able to induce trapped electrons inside the floating gate 302 to go out through the inner dielectric layer and achieve the data erase action.

As a summary, this invention utilizes the polysilicon spacers formed on the sidewalls of the control gate and the floating gate, and the difference in concentration and depth between the source region and the drain region. By applying suitable operating voltage to the polysilicon spacers above the respective source region and drain region, operation of the flash memory can be properly controlled. Because a source-side injection is obtained in this invention, hence a higher programming efficiency is achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing flash memory having at least a semiconductor substrate, a tunneling oxide layer formed above the semiconductor substrate, a floating gate formed above the tunneling oxide layer, an inner dielectric layer formed above the floating gate and a control gate formed above the inner dielectric layer, comprising the steps of (a) coating a photoresist layer over the substrate, and then using the photoresist layer as a mask, performing a first ion implantation to implant ions into a portion of the substrate followed by a thermal operation for driving in the implanted ions to form a drain region in a portion of the substrate;

(b) forming polysilicon spacers on the sidewalls of the control gate, the inner dielectric layer and the floating gate; and (c) performing a second ion implantation to implant ions into a portion of the substrate to form a source region; wherein after step (a) but before step (b), further includes growing an oxide layer over the substrate.

2. The method of claim 1, wherein the step of performing the thermal operation includes heating the substrate.

3. The method of claim 2, wherein the step of heating the substrate is for driving in the implanted ions deeper into the substrate so that the drain region has a greater depth in the substrate and extends partially into the substrate region underneath the floating gate.

4. The method of claim 2, wherein the step of heating the substrate includes heating to a temperature of about 900° C. to 1000° C. for about 10 to 30 minutes.

5. The method of claim 1, wherein the step (b) further includes:

forming a third polysilicon layer over the substrate and the control gate; and etching back the third polysilicon layer and forming polysilicon spacers on the sidewalls of the control gate, the inner dielectric layer and the floating gate.

6. The method of claim 1, wherein the step of performing the first ion implantation includes implanting arsenic or phosphorus ions.

7. The method of claim 6, wherein the step of performing the first ion implantation includes using an energy level of about 50 KeV and a dose level of about $1*10^{15}$ to $8*10^{15}/cm^2$.

8. The method of claim 1, wherein the step of performing the second ion implantation includes implanting arsenic ions.

9. The method of claim 8, wherein the step of performing the second ion implantation includes using an energy level of about 50 KeV and a dose level of about $1*10^{15}/cm^2$.

10. The method of claim 1, wherein the implanted depth in the drain region is greater than in the source region.

11. The method of claim 1, wherein the tunneling oxide layer has a thickness of about 50 Å to 200 Å.

12. The method of claim 1, wherein the inner dielectric layer has a thickness of about 50 Å to 400 Å.

13. The method of claim 5, wherein the third polysilicon layer has a deposited thickness of about 1000 Å to 5000 Å.

14. A method for manufacturing flash memory comprising the steps of:

(a) providing a substrate;

(b) forming a tunneling oxide layer, a first polysilicon layer, and then patterning the first polysilicon layer to form a plurality of separate parallel first polysilicon lines;

(c) forming an inner dielectric layer and a second polysilicon layer above the first polysilicon lines, and then patterning the second polysilicon layer, the inner dielectric layer and the first polysilicon lines to form a plurality of separate parallel second polysilicon lines that are perpendicular to the first polysilicon lines, wherein the second polysilicon line acts as a floating gate and the patterned first polysilicon line acts as control gate of a flash memory array;

(d) coating a photoresist layer over the substrate, and then using the photoresist layer as a mask, performing a first ion implantation to implant ions into a portion of the substrate followed by a thermal operation driving in the implanted ions to form a drain region in a portion of the substrate;

(e) forming polysilicon spacers on the sidewalls of the control gate, the inner dielectric layer and the floating gate; and (f) performing a second ion implantation to implant ions into a portion of the substrate forming a source region; wherein after step (d) but before step (e), further includes growing an oxide layer over the substrate.

15. The method of claim 14, wherein the step of performing the thermal operation includes heating the substrate.

16. The method of claim 15, wherein the step of heating the substrate is for driving in the implanted ions deeper into the substrate so that the drain region has a greater depth in the substrate and extends into the substrate region underneath the floating gate.

17. The method of claim 15, wherein the step of heating the substrate includes heating to a temperature of about 900° C. to 1000° C. for about 10 to 30 minutes.

18. The method of claim 14, wherein the step (e) further includes:

forming a third polysilicon layer over the substrate and the control gate; and etching back the third polysilicon layer and forming polysilicon spacers on the sidewalls of the control gate, the inner dielectric layer and the floating gate.

19. The method of claim 14, wherein the step of performing the first ion implantation includes implanting arsenic or phosphorus ions.

20. The method of claim 19, wherein the step of performing the first ion implantation includes using an energy level of about 50 KeV and a dose level of about $1*10^{15}$ to $8*10^{15}/cm^2$.

21. The method of claim 14, wherein the step of performing the second ion implantation includes implanting arsenic ions.

22. The method of claim 21, wherein the step of performing the second ion implantation includes using an energy level of about 50 KeV and a dose level of about $1*10^{15}/cm^2$.

23. The method of claim 14, wherein the implanted depth in the drain region is greater than in the source region.

24. The method of claim 14, wherein the tunneling oxide layer has a thickness of about 50 Å to 200 Å.

25. The method of claim 14, wherein the inner dielectric layer has a thickness of about 50 Å to 400 Å.

26. The method of claim 18, wherein the third polysilicon layer has a deposited thickness of about 1000 Å to 5000 Å.

* * * * *